United States Patent
Youngner

(10) Patent No.: US 10,084,034 B2
(45) Date of Patent: *Sep. 25, 2018

(54) DEVICES, SYSTEMS, AND METHODS FOR ION TRAPPING

(71) Applicant: Honeywell International Inc., Morris Plains, NJ (US)

(72) Inventor: Daniel Youngner, Maple Grove, MN (US)

(73) Assignee: Honeywell International Inc., Morris Plains, NJ (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/589,370

(22) Filed: May 8, 2017

(65) Prior Publication Data

US 2017/0301748 A1  Oct. 19, 2017

Related U.S. Application Data

(63) Continuation of application No. 15/014,709, filed on Feb. 3, 2016, now Pat. No. 9,647,055, which is a
(Continued)

(51) Int. Cl.
| | |
|---|---|
| H01L 21/76 | (2006.01) |
| H01L 49/02 | (2006.01) |
| H01L 23/48 | (2006.01) |
| H01L 23/64 | (2006.01) |
| H01L 29/94 | (2006.01) |
| H01L 21/768 | (2006.01) |
| H01L 21/02 | (2006.01) |

(Continued)

(52) U.S. Cl.
CPC ........ *H01L 28/40* (2013.01); *H01L 21/02164* (2013.01); *H01L 21/2885* (2013.01); *H01L 21/32055* (2013.01); *H01L 21/7684* (2013.01); *H01L 21/76831* (2013.01); *H01L 21/76898* (2013.01); *H01L 23/481* (2013.01); *H01L 23/5223* (2013.01); *H01L 23/642* (2013.01); *H01L 24/03* (2013.01); *H01L 24/08* (2013.01); *H01L 29/945* (2013.01); *H01L 2224/03462* (2013.01); *H01L 2224/05144* (2013.01); *H01L 2224/08225* (2013.01); *H01L 2924/0002* (2013.01); *H01L 2924/01022* (2013.01); *H01L 2924/01029* (2013.01); *H01L 2924/01074* (2013.01)

(58) Field of Classification Search
None
See application file for complete search history.

(56) References Cited

U.S. PATENT DOCUMENTS

| | | |
|---|---|---|
| 7,180,078 B2 | 2/2007 | Pau et al. |
| 8,039,356 B2 | 10/2011 | Herrin et al. |

(Continued)

OTHER PUBLICATIONS

Niedermayr, et al., "Cryogenic Silicon Surface Ion Trap", https://arxiv.org/abs/1403.5208, May 1, 2015, 14 pp.

(Continued)

*Primary Examiner* — Michael Lebentritt
(74) *Attorney, Agent, or Firm* — Brooks Cameron & Huebsch, PLLC

(57) ABSTRACT

Devices, methods, and systems for ion trapping are described herein. One device includes a through-silicon via (TSV) and a trench capacitor formed around the TSV.

20 Claims, 7 Drawing Sheets

Related U.S. Application Data continuation of application No. 14/686,576, filed on Apr. 14, 2015, now Pat. No. 9,287,348.

(51) Int. Cl.
  *H01L 21/288* (2006.01)
  *H01L 21/3205* (2006.01)
  *H01L 23/522* (2006.01)
  *H01L 23/00* (2006.01)

(56) References Cited

U.S. PATENT DOCUMENTS

| | | |
|---|---|---|
| 8,298,906 B2 | 10/2012 | Bernstein et al. |
| 8,492,241 B2 | 7/2013 | Cheng et al. |
| 8,558,345 B2 | 10/2013 | Kim et al. |
| 8,642,456 B2 | 2/2014 | Bartley et al. |
| 8,921,198 B2 | 12/2014 | Booth, Jr. et al. |
| 9,647,055 B2 * | 5/2017 | Youngner ............... H01L 28/40 |
| 2010/0200949 A1 | 8/2010 | Booth, Jr. et al. |

OTHER PUBLICATIONS

Merrill, et al., "Demonstration of integrated microscale optics in surface-electrode ion traps", New Journal of Physics, vol. 13, No. 10, Oct. 4, 2011, 15 pp.

Extended Search Report from related European Patent Application No. 15195480, dated Jun. 24, 2016, 9 pages.

* cited by examiner

US 10,084,034 B2

DEVICES, SYSTEMS, AND METHODS FOR ION TRAPPING

CROSS REFERENCE TO RELATED APPLICATION

This application is a continuation of U.S. application Ser. No. 15/014,709, filed Feb. 3, 2016, which is a continuation of U.S. application Ser. No. 14/686,576, now U.S. Pat. No. 9,287,348, filed Apr. 11, 2015, the entire specification of which is incorporated herein by reference.

STATEMENT OF GOVERNMENT RIGHTS

This invention was made with Government support under contract: W911NF-12-1-0605, awarded by the U.S. Army. The Government has certain rights in this invention.

TECHNICAL FIELD

The present disclosure relates to devices, systems, and methods for ion trapping.

BACKGROUND

An ion trap can use a combination of electrical and magnetic fields to capture one or more ions in a potential well. Ions can be trapped for a number of purposes, which may include mass spectrometry, research, and/or controlling quantum states, for example.

Previous approaches to ion trapping may include an ion trap surrounded by a number of peripheral wire bonds. Those bonds may restrict optical access around the trap's periphery and hinder visualization and/or imaging of trapped ion(s). Additionally, previous approaches may be space-limited by on-chip filter capacitors.

DETAILED DESCRIPTION

Figure 1:
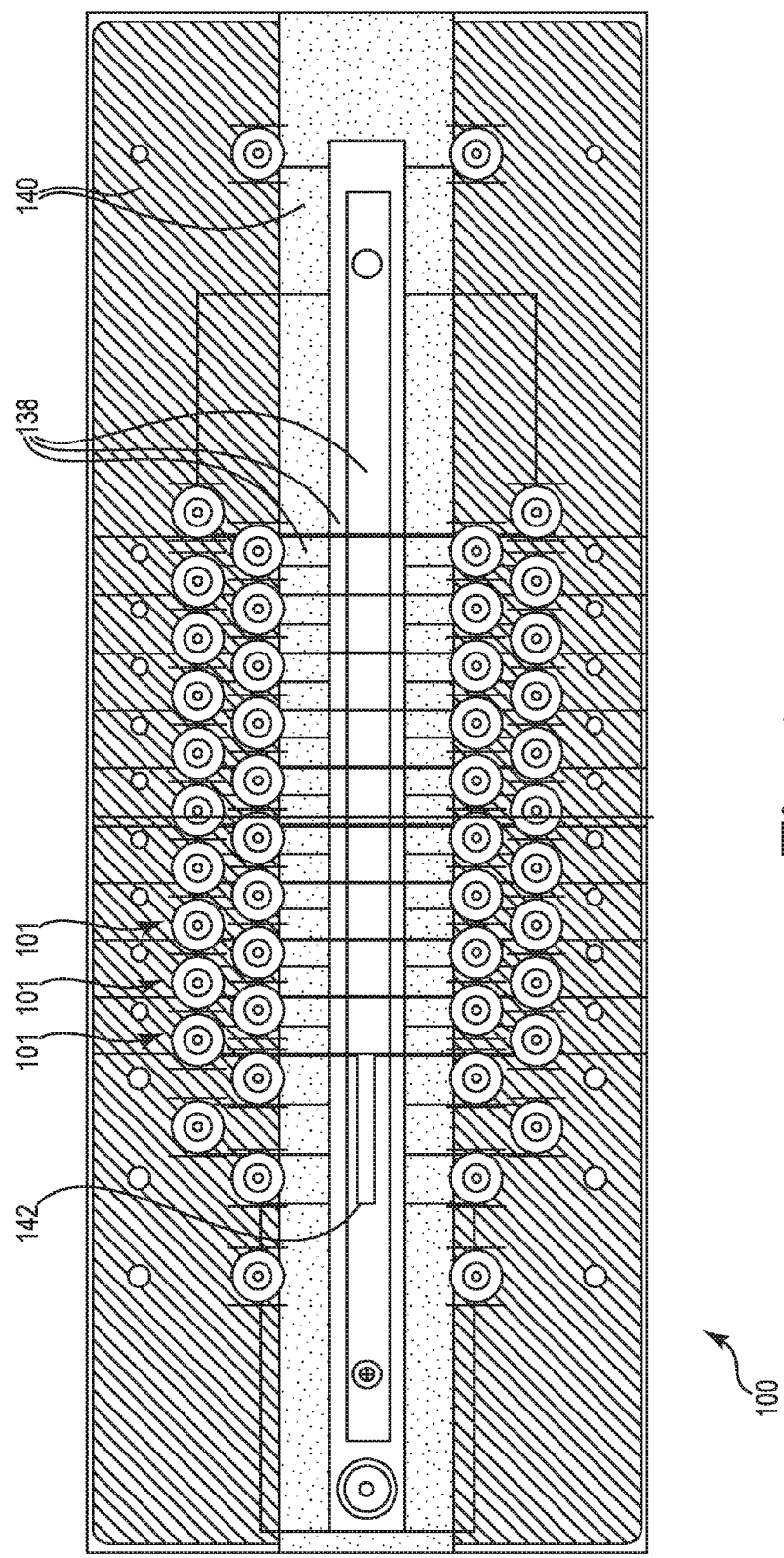
FIG. 1 illustrates a top view of an ion trap in accordance with one or more embodiments of the present disclosure.

Devices, methods, and systems for ion trapping are described herein. For example, one or more embodiments include a through-silicon via (TSV) and a trench capacitor formed around the TSV.

Ions can be trapped in accordance with one or more embodiments of the present disclosure without the use of peripheral wire bonds or surface capacitors present in previous approaches. As a result, ion trapping in accordance with one or more embodiments of the present disclosure can allow easier access to the trapped ion(s) by optical devices (e.g., lasers), and/or imaging devices, for instance.

Embodiments of the present disclosure can include an ion trap mounted atop an interposer die (hereinafter "interposer"). The interposer can contain an array of the trap die leads leading to an outer edge of the interposer. Because ion trapping in accordance with one or more embodiments of the present disclosure can be carried out using a trap die elevated above the wirebonds, full 360-degree optical access to the trap can be provided. By using trench capacitors and TSVs instead of surface capacitors and wirebonds, embodiments of the present disclosure can reduce ion trap size (e.g., by a factor of 30) compared to previous approaches.

In the following detailed description, reference is made to the accompanying drawings that form a part hereof. The drawings show by way of illustration how one or more embodiments of the disclosure may be practiced.

These embodiments are described in sufficient detail to enable those of ordinary skill in the art to practice one or more embodiments of this disclosure. It is to be understood that other embodiments may be utilized and that process changes may be made without departing from the scope of the present disclosure.

As will be appreciated, elements shown in the various embodiments herein can be added, exchanged, combined, and/or eliminated so as to provide a number of additional embodiments of the present disclosure. The proportion and the relative scale of the elements provided in the figures are intended to illustrate the embodiments of the present disclosure, and should not be taken in a limiting sense.

The figures herein follow a numbering convention in which the first digit or digits correspond to the drawing figure number and the remaining digits identify an element or component in the drawing. Similar elements or components between different figures may be identified by the use of similar digits.

FIG. 1 illustrates a top view of an ion trap 100 for trapping ions in accordance with one or more embodiments of the present disclosure. In some embodiments, the ion trap 100 can be approximately 3200 microns by 1120 microns. The ion trap 100 can include a plurality of conductive materials. For instance, the ion trap 100 can include a second conductive material 138, and a third conductive material 140. The ion trap 100 can include a first conductive material, for instance, not shown in the example illustrated in FIG. 1, but shown in FIGS. 2 and/or 6 herein. In some embodiments, the first conductive material can form a ground plane; the second conductive material 138 can form a signal routing plane, and the third conductive material 140 can form a ground connection and/or DC electrode rail plane.

As shown in FIG. 1, the ion trap 100 includes a plurality of devices (e.g., direct current (DC) electrodes) 101 for ion trapping. The devices 101 can each be analogous to the device(s) 201 and/or 301, respectively discussed below in connection with FIGS. 2 and/or 3, for instance. Each of the devices 101 can include a TSV and a trench capacitor. While some portion of the devices 101 would otherwise be underneath, and thus obscured by, the third conductive material 140, the devices 101 are shown in FIG. 1 for purposes of illustration.

It is noted that the positioning and/or layout of the devices 101 shown in FIG. 1 is not to be taken in a limiting sense; that is, embodiments of the present disclosure are not limited to the positioning and/or layout of the devices 101 shown in FIG. 1. The ion trap 100 can be bonded to an interposer, for instance, such as that described below in connection with FIG. 6. In some embodiments, the interposer can be approximately 1 centimeter by 1 centimeter.

One or more ions can pass from a bottom of the ion trap 100 to a top of the ion trap 100 through an atom loading slot 142. The loading slot 142 can be located on the ground plane of the ion trap 100, for instance, and can be substantially centered on a longitudinal axis of the ion trap 100. Once an ion passes above the top surface of the ground plane, the ion can be trapped in a potential well using electrical and/or magnetic fields created by the devices 101. The electrical and/or magnetic fields can be controlled by one or more connected devices (e.g., a controller and/or computing device) via one or more bonds to an interposer (discussed below in connection with FIG. 6).

Figure 2:
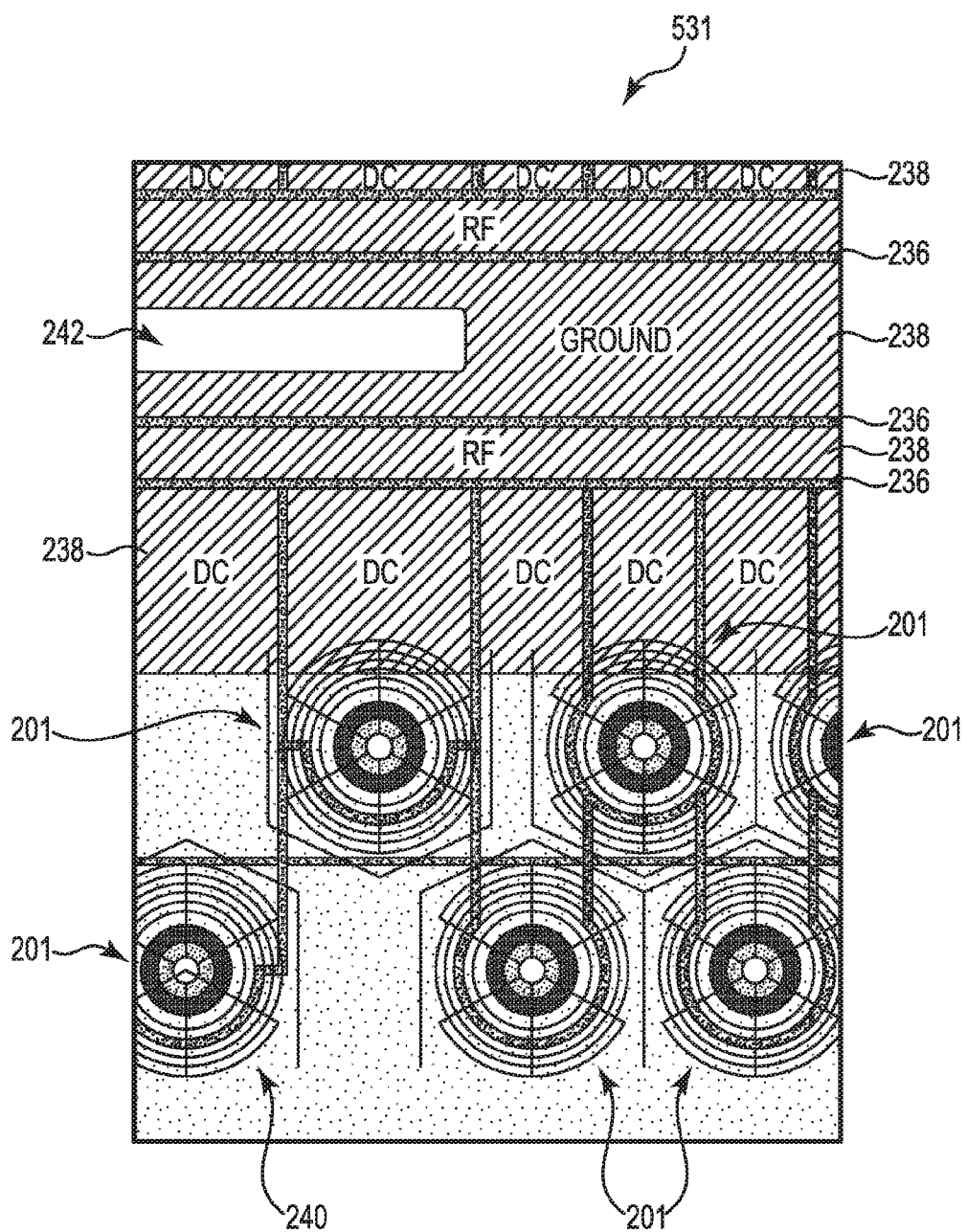
FIG. 2 illustrates a top detailed view of a portion of the ion trap illustrated in FIG. 1 in accordance with one or more embodiments of the present disclosure.

FIG. 2 illustrates a top detailed view of a portion of the ion trap 100 for trapping ions illustrated in FIG. 1 in accordance with one or more embodiments of the present disclosure. As shown, the portion of the ion trap includes a first conductive material 236, a second conductive material 238, and a third conductive material 240. The first conductive material 236 can form a ground plane; the second conductive material 238 can form a signal routing plane, and the third conductive material 240 can form a ground and/or DC electrode rail plane.

As shown in FIG. 2, the ion trap can include a plurality of devices (e.g., DC electrodes) 201 for ion trapping. The devices 201 can each be analogous to the device(s) 101 and/or 301, respectively discussed herein in connection with FIGS. 1 and/or 3, for instance. Each of the devices 201 can include a TSV and a trench capacitor. While some portion of the devices 201 would otherwise be underneath, and thus obscured by, the third conductive material 240, the devices 201 are shown in FIG. 2 for purposes of illustration. It is again noted that the positioning and/or layout of the devices shown in FIG. 2 is not to be taken in a limiting sense; that is, embodiments of the present disclosure are not limited to the positioning and/or layout of the devices 201 shown in FIG. 2.

As previously discussed, one or more ions can pass from a bottom of the ion trap to a top of the ion trap through a loading slot 242. The loading slot 242 can be located on the ground plane of the ion trap, for instance, and can be substantially centered on a longitudinal axis of the ion trap. Once an ion passes above the top surface of the ground plane, the ion can be trapped in a potential well using electrical and/or magnetic fields created by the devices 201.

Figure 3:
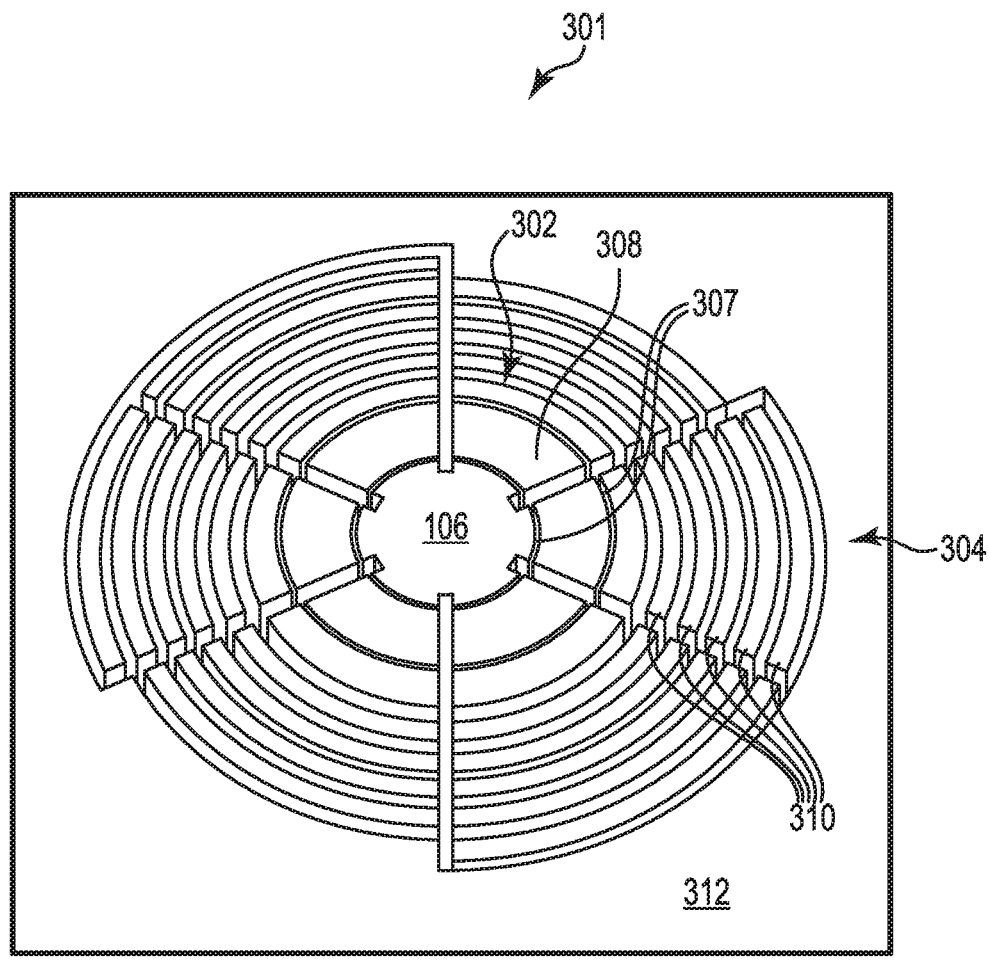
FIG. 3 illustrates a perspective view of a device of an ion trap in accordance with one or more embodiments of the present disclosure.

FIG. 3 illustrates a perspective view of a device (e.g., DC electrode) 301 for ion trapping in accordance with one or more embodiments of the present disclosure. The device 301 includes a through-silicon via (TSV) 302 formed in a substrate 312 and a trench capacitor 304 formed around the TSV 302 in the substrate 312. The substrate 312 can be a conductive material, for instance. In some embodiments, the substrate 312 can be silicon (e.g., a silicon wafer).

The TSV 302 includes a core 306 and a ring 308. The core 306 can be a conductive material, for instance. In some embodiments, the core can be silicon, though embodiments of the present disclosure are not so limited. The ring 308 can be a conductive material, such as polysilicon, for instance, though embodiments of the present disclosure are not so limited. Between the core 306 and the ring 308, and between the ring 308 and the substrate 312, can be a dielectric material 307. In some embodiments, the dielectric material can be silicon dioxide (e.g., formed via thermal oxidation), for instance, though embodiments of the present disclosure are not so limited.

The TSV 302 can extend through the substrate 312. That is, the TSV can have a height (or depth) equal to a thickness of the substrate 312 (e.g., between 5 and 250 microns). In some embodiments, the TSV 302 can have a height of between 50 and 500 microns. In some embodiments, the TSV 302 can have a height of approximately 300 microns.

The trench capacitor 304 can extend partially through the substrate 312. That is, the trench capacitor can have a height (or depth) of less than the thickness of the substrate 312. In some embodiments, the trench capacitor 304 can have a depth of between and 250 microns. In some embodiments, the trench capacitor 304 can have a height of approximately 65 microns. Embodiments of the present disclosure do not limit trench capacitors to a particular height.

The trench capacitor 304 can include a plurality of annular rings 310 (herein referred to as "rings 310"). Each of the rings 310 can be a different distance from the TSV 302 (e.g., from a center of the TSV 302). In some embodiments, a distance between each of the rings 310 (e.g., a center of each of the rings) can be constant. In some embodiments, a distance between one of the rings 310 and an adjacent one of the rings 310 can be between 2 and 25 microns. In some embodiments, a distance between one of the rings 310 and an adjacent one of the rings 310 can be approximately 6 microns. In some embodiments, a distance between an outermost one of the rings 310 and the TSV 302 (e.g., the center of the TSV 302) can be between 50 and 70 microns.

Though six rings 310 are shown in the embodiment illustrated in FIG. 3, embodiments of the present disclosure are not so limited and such illustration is not to be taken in a limiting sense. Additionally, though the rings 310 are shown in FIG. 3 as each completely encircling the TSV 302, some embodiments include one or more of the rings 310 partially (e.g., not fully) encircling the TSV 302. The rings 310 can be formed, as discussed further below in connection with FIGS. 5A and/or 5B, by removing portions of the substrate 312. The vacancies (e.g., openings) in the substrate defined by the rings can be filled with a conductive material. The conductive material can be polysilicon (e.g., $1E19/cm^3$ boron-doped polysilicon), for instance, though embodiments of the present disclosure are not so limited.

In some embodiments, the trench capacitor 304 can have a capacitance of approximately 100 picofarads (e.g., between 50 and 150 picofarads). In some embodiments, the trench capacitor 304 can have a capacitance of approximately 200 picofarads (e.g., between 150 and 250 picofarads). In some embodiments, the trench capacitor 304 can have a capacitance of approximately 400 picofarads (e.g., between 250 and 600 picofarads).

Figure 4A:
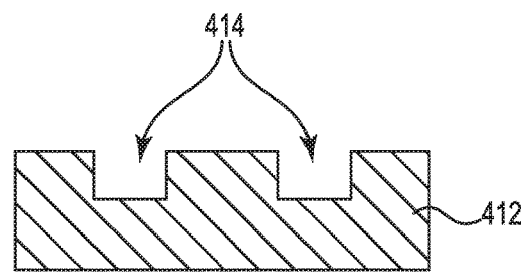
FIG. 4A illustrates a process stage associated with forming a through-silicon via (TSV) in accordance with one or more embodiments of the present disclosure.

FIGS. 4A-4D illustrate various process stages associated with forming a TSV in accordance with one or more embodiments of the present disclosure. As shown in FIG. 4A, a ring-shaped opening 414 (herein referred to as opening 414) can be formed in a substrate 412. The opening 414 can be defined by a plurality of surfaces of the substrate 412.

In some embodiments, the opening 414 can be formed by an etching process, such as deep reactive-ion etching (DRIE), for instance. The opening 414 can be formed to a depth in the substrate 412 of between 300 and 400 microns. In some embodiments, the opening 414 can be formed to a depth of approximately 340 microns. The substrate can be a conductive material, such as silicon for instance. In some embodiments, the substrate can be a p++ silicon wafer (e.g., a wafer approximately 500 microns thick).

The opening 414 can be between 5 and 10 microns wide. In some embodiments, the opening can be approximately 8 microns wide. An interior diameter of the opening 414 can be between 30 and 35 microns wide. In some embodiments, the interior diameter can be approximately 32 microns. Accordingly, in some embodiments, an exterior diameter of the opening 414 can be approximately 48 microns.

Figure 4B:
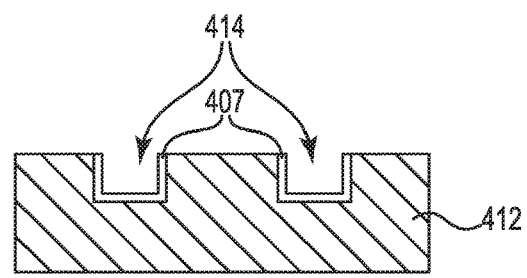
FIG. 4B illustrates a process stage associated with forming a through-silicon via (TSV) in accordance with one or more embodiments of the present disclosure.
Figure 4C:
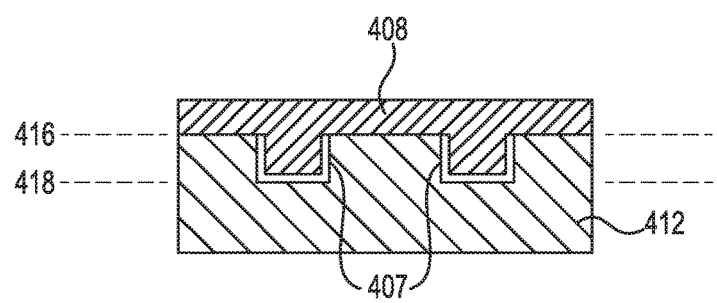
FIG. 4C illustrates a process stage associated with forming a through-silicon via (TSV) in accordance with one or more embodiments of the present disclosure.

As shown in FIG. 4B, a dielectric material 407 (e.g., silicon dioxide) can be formed on the surface(s) of the opening 414. In some embodiments, the dielectric material 407 can be formed to approximately 1.5 microns thick. Then, as shown in FIG. 4C, a conductive material 408 (e.g., polysilicon) can be formed (e.g., deposited) in the opening 414 over the dielectric material 407.

Figure 4D:
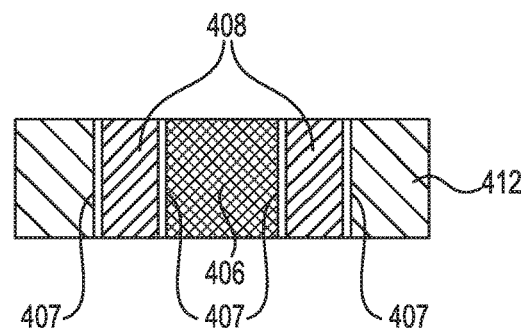
FIG. 4D illustrates a process stage associated with forming a through-silicon via (TSV) in accordance with one or more embodiments of the present disclosure.

A portion of the conductive material 408 can be removed from the top to line 416. A portion of the substrate 412 can be removed from the bottom to line 418. That is, a top surface of the substrate 412 and a bottom surface of the substrate 412 can be planarized. In some embodiments, such removal can be carried out via a planarization process (e.g., chemical-mechanical polishing). Accordingly, as shown in FIG. 4D, the conductive material 408 and the dielectric material 407 can extend through the substrate 412. That is, the conductive material 408 and the dielectric material 407 can extend from the top of the substrate 412 to the bottom of the substrate 412.

Figure 4E:
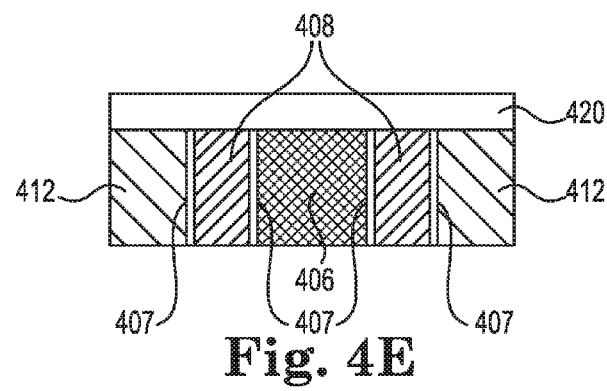
FIG. 4E illustrates a process stage associated with forming an electroplated TSV from the TSV illustrated in FIG. 4D in accordance with one or more embodiments of the present disclosure.
Figure 4F:
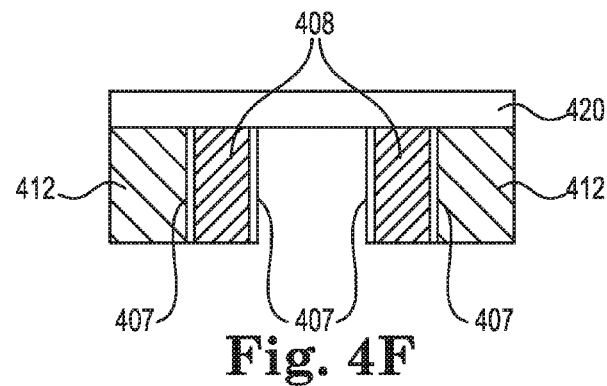
FIG. 4F illustrates a process stage associated with forming an electroplated TSV from the TSV illustrated in FIG. 4D in accordance with one or more embodiments of the present disclosure.

In some embodiments, forming the TSV can include forming an electroplated TSV. FIGS. 4E-4H illustrate various process stages associated with forming an electroplated TSV from the TSV illustrated in FIG. 4D in accordance with one or more embodiments of the present disclosure. As shown in FIG. 4E, a conductive material 420 (e.g., a second conductive material) can be formed over the conductive material 408, the substrate, 412 and the dielectric material 407. In some embodiments, the conductive material 408 can be a metal (e.g., gold). As shown in FIG. 4F, the core 406 of the TSV can be removed. Removal can include an etching process (e.g., DRIE) for instance.

Figure 4G:
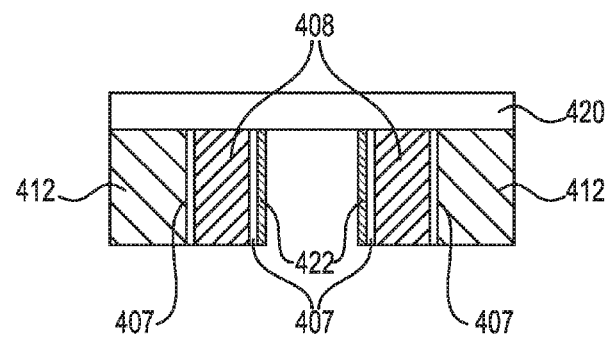
FIG. 4G illustrates a process stage associated with forming an electroplated TSV from the TSV illustrated in FIG. 4D in accordance with one or more embodiments of the present disclosure.

As shown in FIG. 4G, a plating base material 422 can be formed (e.g., deposited) on the dielectric material 407 (e.g., the sidewalls of the dielectric material 407). The plating base material 422 can be a conductive material. In some embodiments, the plating base material 422 can be a metal or metal alloy. Metal alloys used for the plating base material 422 can include titanium, tungsten, and/or copper, for instance, though embodiments of the present disclosure are not so limited.

Figure 4H:
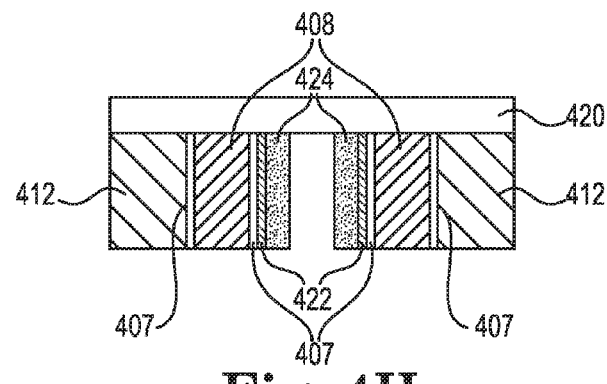
FIG. 4H illustrates a process stage associated with forming an electroplated TSV from the TSV illustrated in FIG. 4D in accordance with one or more embodiments of the present disclosure.

A vacuum can be formed to allow another (e.g., third) conductive material 424 can be formed (e.g., electroplated) on the conductive material 420 and the plating base material 422 (e.g., the sidewalls of the plating base material 422) as shown in FIG. 4H. The third conductive material 424 can be a metal, such as copper, for instance, though embodiments of the present disclosure are not so limited. In some embodiments, the third conductive material 424 can be a same material as the second conductive material 420. In some embodiments, the third conductive material 424 can be a different material than the second conductive material 420.

Electroplated TSVs may exhibit reduced Johnson noise and resistance compared with non-electroplated TSVs. For example, whereas a TSV having a silicon core may exhibit approximately 12 Ohms of resistance and a Johnson noise at 300 Kelvin of 5E-10V/sqrt (Hz), a TSV having an electroplated lining may exhibit approximately 0.025 Ohms of resistance and a Johnson noise at 300 Kelvin of 2E-11V/sqrt (Hz).

Figure 5A:
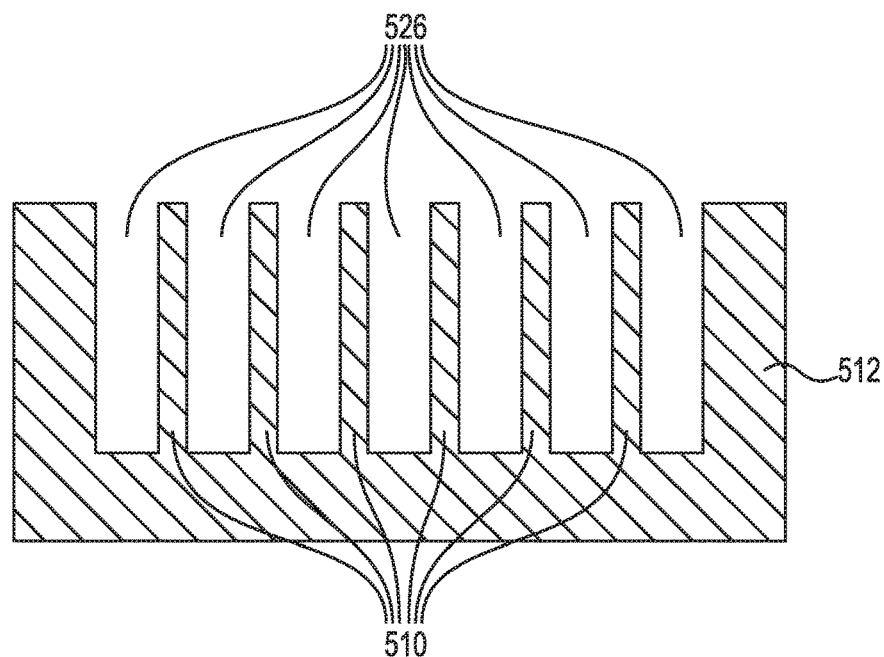
FIG. 5A illustrates a process stage associated with forming a trench capacitor in accordance with one or more embodiments of the present disclosure.
Figure 5B:
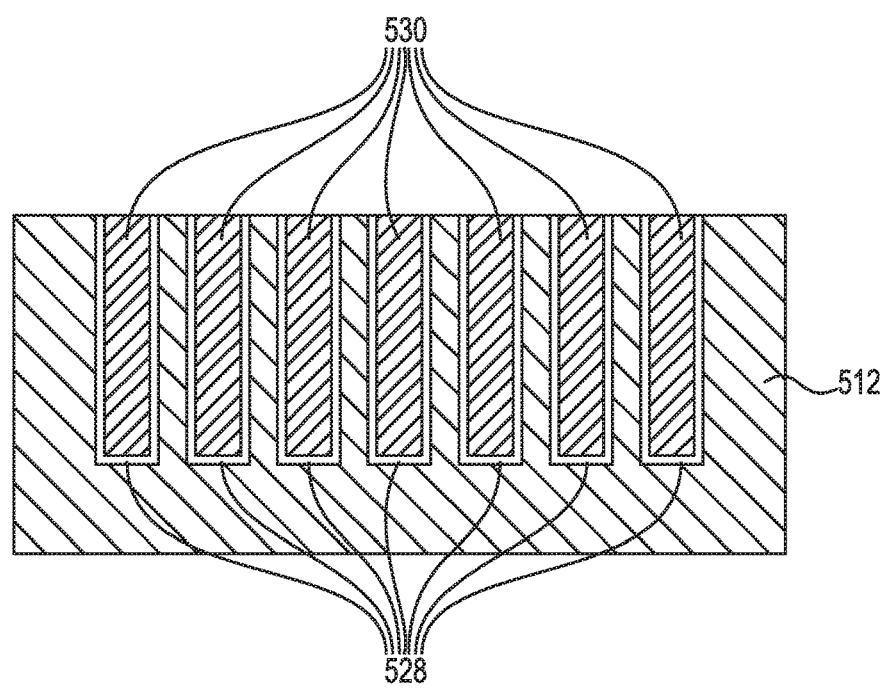
FIG. 5b illustrates a process stage associated with forming a trench capacitor in accordance with one or more embodiments of the present disclosure.

FIGS. 5A and 5B illustrate various process stages associated with forming a trench capacitor in accordance with one or more embodiments of the present disclosure. As shown in FIG. 5A, a plurality of annular openings 526 can be formed in the substrate 512. The annular openings 526 can be formed by an etching process (e.g., DRIE), though embodiments of the present disclosure are not so limited.

As previously discussed, the annular openings 526 can be formed to a depth of approximately 65 microns. The formation of the annular openings 526 can define a plurality of rings 510, which can be analogous to the rings 310, previously discussed in connection with FIG. 3.

As shown in FIG. 5B, a dielectric material 528 can be formed in the annular openings 526. The dielectric material 528 can be silicon dioxide (e.g., formed via thermal oxidation), for instance, though embodiments of the present disclosure are not so limited. A conductive material 530 can be formed in the openings 526 on the dielectric material 528. That is, the openings 526 can be filled with the conductive material 530. In some embodiments, the conductive material 528 is polysilicon.

Figure 6:
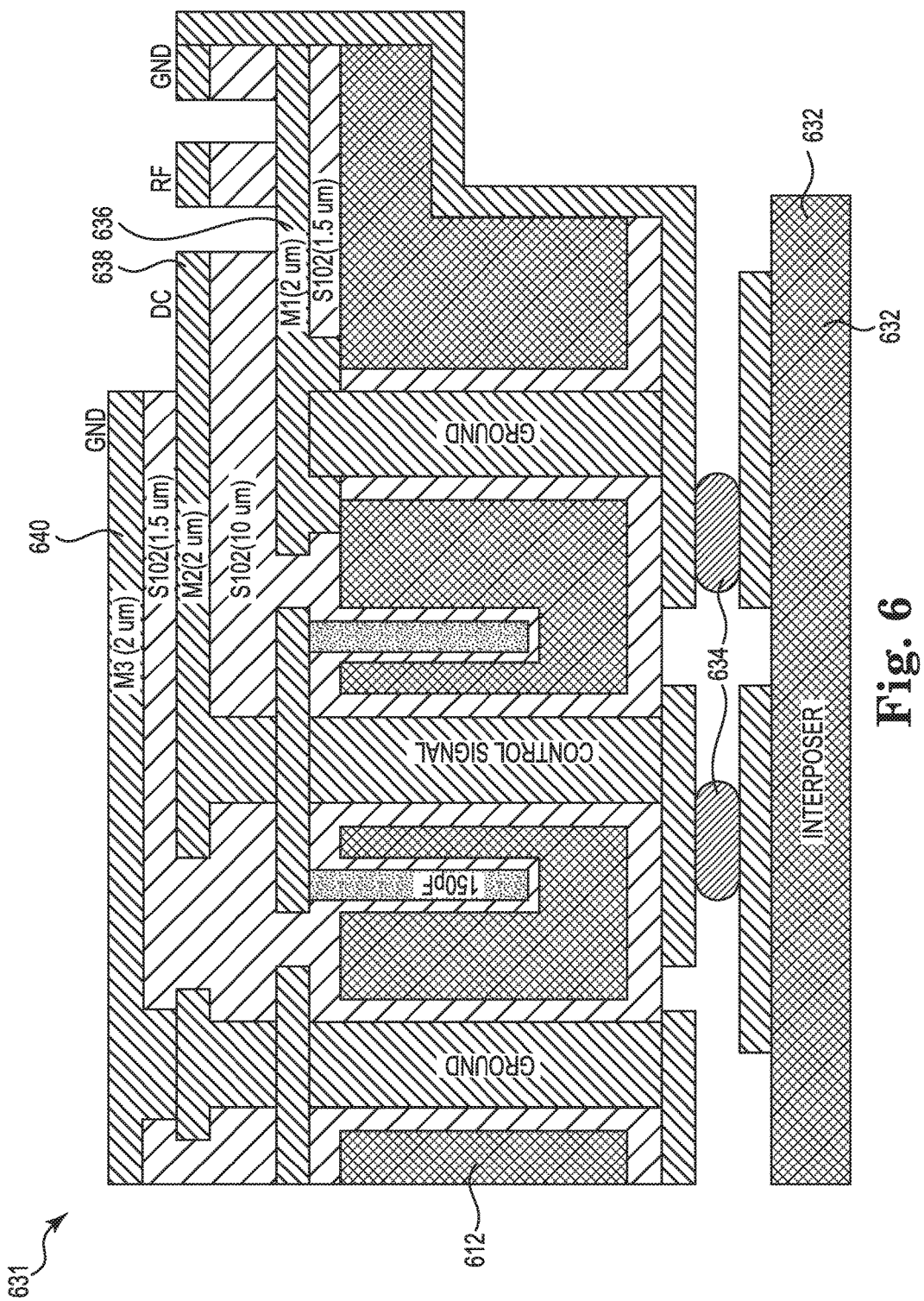
FIG. 6 illustrates a cross-sectional view of a portion of an ion trap for in accordance with one or more embodiments of the present disclosure.

FIG. 6 illustrates a cross-sectional view of a portion of an ion trap for ion trapping in accordance with one or more embodiments of the present disclosure. In some embodiments, FIG. 6 can illustrate a system 631 for trapping ions in accordance with one or more embodiments of the present disclosure. As shown the system 631 includes a substrate 612 comprising a TSV 602 and a trench capacitor 604.

The substrate 612 can be bonded to an interposer 632 via a plurality of bond pads 634. The bond pads 634 can be a conductive material (e.g., gold). Embodiments of the present disclosure can allow optical access to the system 631 by using the bond pads 634 to bond the substrate 612 to the interposer 632 instead of using wire bonds that connect directly to the substrate 612 as in previous approaches.

Formed on (e.g., above) the substrate can be a plurality of (e.g., 3) planar conductive materials: a first conductive material 636, a second conductive material 638, and a third conductive material 640. Each of the conductive materials 636, 638, and 640 can be separated by a dielectric material (e.g., silicon dioxide). In some embodiments, the conductive materials 636, 638, and 640 can be gold. Each of the conductive materials 636, 638, and 640 can be formed to approximately 1.5 microns thick. The first conductive material 636 can form a ground plane; the second conductive material 638 can form a signal routing plane; and the third conductive material 640 can form a ground and/or DC electrode rail plane.

The interposer 632 can control the operation of the system 631 using static direct current (DC) and/or radio frequency (RF) oscillating electric fields to trap one or more ions above the surface of the system 631 (e.g., above the surface of the ground plane formed by the second conductive material 638).

Although specific embodiments have been illustrated and described herein, those of ordinary skill in the art will appreciate that any arrangement calculated to achieve the same techniques can be substituted for the specific embodiments shown. This disclosure is intended to cover any and all adaptations or variations of various embodiments of the disclosure.

It is to be understood that the above description has been made in an illustrative fashion, and not a restrictive one. Combination of the above embodiments, and other embodiments not specifically described herein will be apparent to those of skill in the art upon reviewing the above description.

The scope of the various embodiments of the disclosure includes any other applications in which the above structures and methods are used. Therefore, the scope of various embodiments of the disclosure should be determined with reference to the appended claims, along with the full range of equivalents to which such claims are entitled.

In the foregoing Detailed Description, various features are grouped together in example embodiments illustrated in the figures for the purpose of streamlining the disclosure. This method of disclosure is not to be interpreted as reflecting an intention that the embodiments of the disclosure require more features than are expressly recited in each claim.

Rather, as the following claims reflect, inventive subject matter lies in less than all features of a single disclosed embodiment. Thus, the following claims are hereby incorporated into the Detailed Description, with each claim standing on its own as a separate embodiment.

What is claimed:

1. A device for ion trapping, comprising:
    a through-silicon (TSV), wherein forming the TSV includes:
        forming a ring-shaped opening in a substrate, the opening defined by a plurality of surfaces;
        forming a dielectric material on the plurality of surfaces; and
        forming a conductive material on the dielectric material; and
    a trench capacitor formed around the TSV.

2. The device of claim 1, wherein the TSV has a height equal to a thickness of the substrate.

3. The device of claim 1, wherein the trench capacitor has a height of less than the thickness of the substrate.

4. The device of claim 1, wherein the trench capacitor has a height of approximately 65 microns.

5. The device of claim 1, wherein the TSV has a height of between 50 and 500 microns.

6. The device of claim 1, wherein the TSV has a height of approximately 300 microns.

7. The device of claim 1, wherein at least one ion passes from a bottom of the ion trap to a top of the ion trap through an atom loading slot.

8. A system for ion trapping, comprising:
    a substrate comprising a plurality of devices, each device comprising:
        a through-silicon via (TSV), wherein forming the TSV includes:
            forming a ring-shaped opening in the substrate, the opening defined by a plurality of surfaces;
            forming a dielectric material on the plurality of surfaces; and
            forming a conductive material on the dielectric material;
        a trench capacitor formed around the TSV; and
        an interposer bonded to the substrate.

9. The system of claim 8, wherein the interposer is bonded to the substrate via a plurality of bond pads.

10. The system of claim 8, wherein the substrate is silicon.

11. A method of forming a device for ion trapping, comprising:
    forming a through-silicon via (TSV) in a substrate, wherein forming the TSV includes:
        forming a ring-shaped opening in the substrate, the opening defined by a plurality of surfaces;
        forming a dielectric material on the plurality of surfaces; and
        forming a conductive material on the dielectric material; and
    forming a trench capacitor around the TSV in the substrate.

12. The method of claim 11, wherein forming the trench capacitor around the TSV in the substrate includes:
    forming a plurality of annular openings in the substrate;
    forming a dielectric material in the openings; and
    forming a conductive material on the dielectric material.

13. The method of claim 11, wherein forming the TSV includes planarizing a top surface of the substrate and a bottom surface of the substrate, wherein the conductive material and the dielectric material extend from the top of the substrate to the bottom of the substrate subsequent to planarizing the top surface of the substrate and the bottom of the substrate.

14. The method of claim 11, wherein the dielectric material is silicon dioxide.

15. The method of claim 11, wherein the ring-shaped opening is formed by an etching process.

16. The method of claim 11, wherein forming the TSV includes forming an electroplated TSV.

17. The method of claim 11, wherein formed on the substrate is a plurality of planar conductive materials, and wherein the plurality of planar conductive materials includes:
    a first conductive material;
    a second conductive material; and
    a third conductive material.

18. The method of claim 17, wherein each of the conductive materials are separated by a dielectric material.

19. The method of claim 17, wherein the first conductive material forms a ground plane, the second conductive material forms a signal routing plane, and the third conductive material forms a DC electrode rail plane.

20. The method of claim 17, wherein the conductive material is gold.

* * * * *